United States Patent [19]

Hara et al.

[11] Patent Number: 5,444,304
[45] Date of Patent: Aug. 22, 1995

[54] SEMICONDUCTOR DEVICE HAVING A RADIATING PART

[75] Inventors: Kouji Hara; Jun Tanabe, both of Hadano, Japan

[73] Assignee: Hitachi, Ltd., Tokyo, Japan

[21] Appl. No.: 111,308

[22] Filed: Aug. 24, 1993

[30] Foreign Application Priority Data

Aug. 24, 1992 [JP] Japan .................. 4-223925

[51] Int. Cl.⁶ ............................... H01L 23/36
[52] U.S. Cl. ..................... 257/796; 257/722
[58] Field of Search ............... 257/706, 707, 712, 720, 257/722, 787, 796

[56] References Cited

U.S. PATENT DOCUMENTS

| | | | |
|---|---|---|---|
| 5,155,579 | 10/1992 | AuYeung | 257/787 |
| 5,194,935 | 3/1993 | Kitano et al. | 257/722 |
| 5,296,740 | 3/1994 | Sono et al. | 257/796 |

Primary Examiner—Gene M. Munson
Attorney, Agent, or Firm—Antonelli, Terry, Stout & Kraus

[57] ABSTRACT

A semiconductor device constituted by a VSMP (Vertical Surface Mount Package) is provided in which a thickness of a plastic package encapsulating a semiconductor chip is very small, wherein even when a semiconductor chip having large power consumption is contained therein, the effect of heat radiation can be effectively improved. A VSMP constituting the semiconductor device, which is mounted perpendicularly on a surface of a substrate, includes: external connection terminals for supplying I/O signals from peripheral circuits and electric power to the semiconductor chip; supporting terminals for holding the VSMP in a perpendicularly-mounted state; a plastic package for protecting the internal elements; and radiating fins with an irregular configuration provided on both sides of the plastic package. The radiating fins having the irregular configuration are formed so as to extend in a direction of a length of the semiconductor device and are formed on both the front side and the rear side of the plastic package.

5 Claims, 3 Drawing Sheets

5,444,304

SEMICONDUCTOR DEVICE HAVING A RADIATING PART

BACKGROUND OF THE INVENTION

The present invention relates to a semiconductor device, and, more particularly, to the heat radiation technology of a semiconductor device including a semiconductor chip having large power consumption in a vertical surface mount package (hereinafter, referred to as "VSMP" for short, when applicable) which is mounted perpendicularly on a surface of a substrate.

In recent years, as high integration and high processing speed of semiconductor devices have been remarkably promoted, and improvements in functions, miniaturization and high reliability of electronic apparatuses have also been promoted, improvements in functions accompanied therewith have been required in semiconductor packages as well. That is, improvements have been neccessary in the effect of heat radiation of the packages coping with the needs for the minituarization of the packages, and the high integration and the high processing speed of the semiconductor devices, and the promotion of the multiple pins and the narrow pitch of the packages accompanied with the miniaturization and the high integration of the semiconductor devices.

In such packaging technology of the semiconductor devices, in order to cope with the low cost, the miniaturization and the promotion of the multiple pins of the package, plastic packaging has been switched over from the standard DIP (Dual In-line Package) to the surface mount package. Further, the surface mount package which is realized in the plastic package is the indispensable mounting style in order to fulfill the requirements for high performance and high reliability.

For example, in the plastic package, especially in order to improve the mounting density, there has been proposed a package structure of VSMP type. In the package structure of VSMP type, a package is mounted perpendicularly on a surface of a substrate and thus the surface mounting technology can be applied to the package. One known semiconductor device having VSMP, is a package which has a very small thickness of about 1.2 mm and is lighter than the prior art package, wherein heat can be radiated from both sides of a semiconductor chip to the outside through the package.

SUMMARY OF THE INVENTION

It is therefore an object of the present invention to provide a semiconductor device in which in the case where a semiconductor chip having large power consumption is mounted in a VSMP, heat radiation is capable of being improved.

It is another object of the present invention to provide a semiconductor device in which the effect of heat radiation is capable of being improved by forming radiating fins integrally with a surface of a plastic package with a plastic mold, especially in VSMP having a very thin plastic package encapsulating a semiconductor chip.

It is still another object of the present invention to provide a semiconductor device in which the effect of heat radiation is capable of being improved in the above-mentioned VSMP and which is capable of being mounted on the same area of a surface of a substrate as that required for the prior art VSMP to be mounted on a surface of a substrate.

A semiconductor device according to the present invention is a VSMP including external connection terminals for supplying I/O signals from peripheral circuits and electric power to a semiconductor chip, and a plastic package for protecting the semiconductor chip and the like, and may provide that radiating fins having an irregular configuration are provided on either one side or both sides of the plastic package encapsulating the both sides of the semiconductor chip.

In one preferred embodiment, radiating fins having the irregular configuration are provided on the both sides of the plastic package in such a way that the radiating fins provided on the right side of the plastic package do not confront in position with the radiating fins provided on the rear side of the plastic package through the plastic package.

Further, the radiating fins having the irregular configuration are provided so as to extend in a direction of a length of the semiconductor device.

Incidentally, the term length of the semiconductor device means a length indicated by the reference symbol a in FIG. 8. FIG. 8 will be described in detail later.

DESCRIPTION OF THE PREFERRED EMBODIMENTS

Firstly, a structure of a semiconductor device of an embodiment of the present invention will hereinafter be described in detail with reference to FIGS. 1 and 2.

A semiconductor device (VSMP) 1 of the present embodiment contains a semiconductor chip 6 having large power consumption which is connected from its electrode parts to inner lead parts of external connection terminals 2 through metallic wires 7. I/O signal are input/output to/from the semiconductor chip 6 through the external connection terminals 2.

Further, the semiconductor chip 6 is encapsulated with a plastic package 4.

Figure 8:
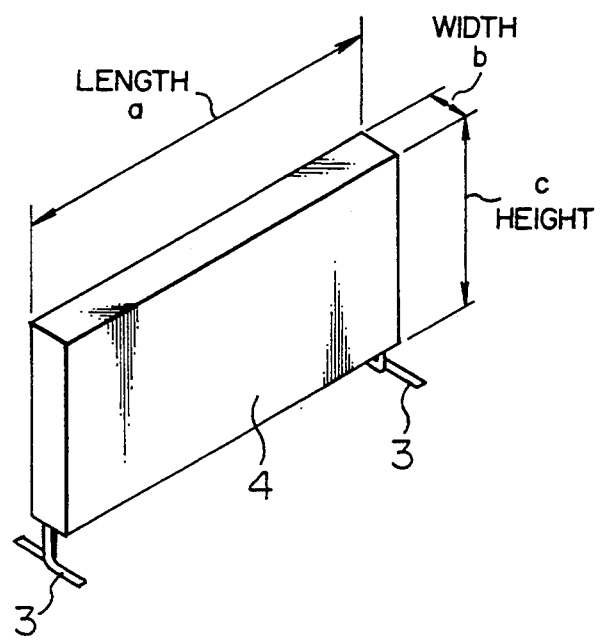
FIG. 8 is a schematic perspective view useful in explaining the definition of the size of the semiconductor device (VSMP) in the present specification.

Now, the plastic package 4 has a rectangular perallelopiped shape having the size, i.e., a length a, a width b and a height c shown in FIG. 8. This rectangular perallelopiped is not necessarily a rectangular perallelopiped which is mathematically defined. For example, a line or vertex which is surrounded by two surfaces or three surfaces on the rectangular perallelopiped may be rounded. Hereinafter, in the present specification, a, b and c shown in FIG. 8 are respectively defined as the length, the width and the height of the semiconductor device. In addition, two surfaces which are determined by both the length a and the height c are respectively defined as a first surface and a second surface.

Moreover, two surfaces which are determined by both the width b and the height c are defined as side surfaces of the semiconductor device (VSMP).

Further, out of two surfaces which are determined by both the length a and the width b, one corresponding to the upper part of the semiconductor device (VSMP) is defined as an upper surface, and the other corresponding to the bottom part thereof is defined as a bottom surface.

Figure 1:
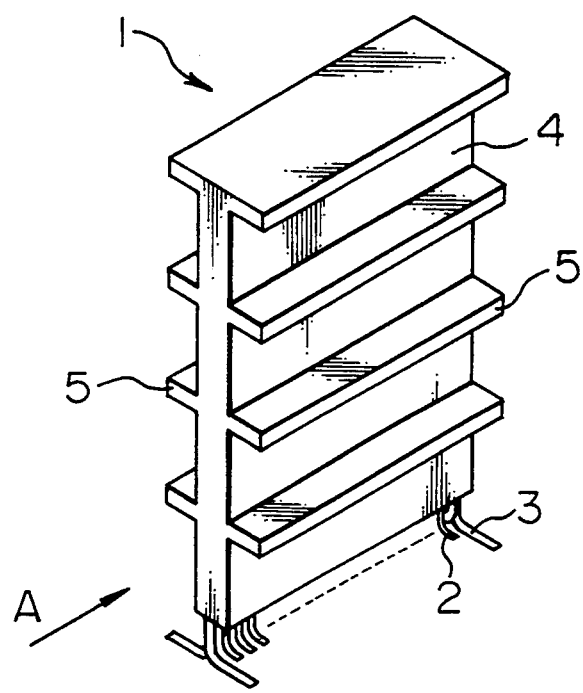
FIG. 1 is an exterior perspective view showing a structure of a semiconductor device as an embodiment of the present invention.
Figure 2:
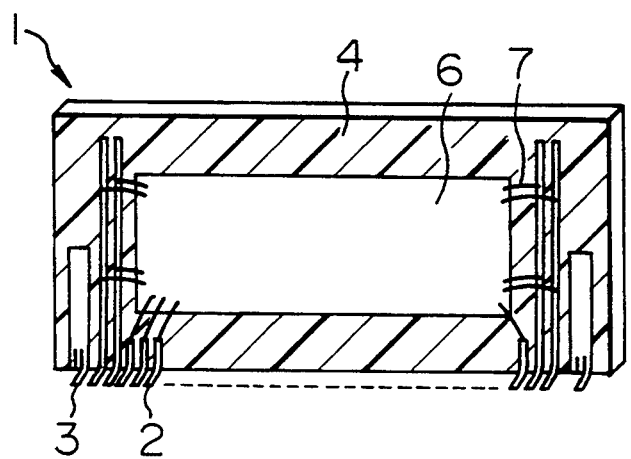
FIG. 2 is a schematic sectional view showing an internal structure of the semiconductor device as the embodiment of the present invention shown in FIG. 1.

Incidentally, for the sake of simplicity, both the radiating fins 5 and the external connection terminals 2 shown in FIG. 1 are not illustrated in FIG. 8. Moreover, hereinafter, it is assumed that in the case where the size, i.e., the length, the width and the height of the semiconductor device will be stated in the present specification, that size, i.e., the length, the width and the height means the size, i.e., the length, the width and the height of the plastic package 4.

Moreover, the external connection terminals 2 are extracted to the outside of the plastic package 4. In this connection, supporting terminals 3 are provided in the plastic package 4 in such a way that when the plastic package 4 is mounted on a surface of a substrate, the first or second surface is substantially perpendicular to the surface of the substrate. Therefore, the first and second surfaces are perpendicular surfaces in the semiconductor device VSMP 1.

Further, the plastic package 4 has radiating fins 5 having an irregular configuration as an important feature of the present invention. The radiating fins 5 may be provided on either the first surface or the second surface. The radiating fins 5 having the irregular configuration are present on the surface or surfaces of the device which are parallel to the substrate perpendicular so as to extend in a direction of the length a of the VSMP.

Moreover, it can be said that the radiating fins 5 are formed by making a parallel translation of the configuration of the radiating fins 5, when viewed from the direction of A in FIG. 1, in the direction of the length a of the semiconductor device VSMP.

Therefore, each radiating fin 5 shown in FIG. 1 is formed by making a parallel translation of a rectangle 11 (a part surrounded by a broken line of FIG. 5) as the side surface of the radiating fin 5, when viewed from the direction of A of FIG. 1, in the direction of the length a of the semiconductor device.

Therefore, if the semiconductor device VSMP 1 of the present invention is mounted on the surface of the substrate by supporting terminals 3 and the VSMP 1 thus mounted is forcedly cooled along a transverse axis (i.e., in the direction of the length a of the plastic package) between the first or second surface (i.e., the perpendicular surface of VSMP) of the VSMP and the surface of the substrate, the cooling air flow is not hindered by any radiating fin 5. As a result, good air flow is obtained in the circumference of the semiconductor device VSMP, and thus it is possible to improve the effect of heat radiation from the radiating fins 5.

Figure 5:
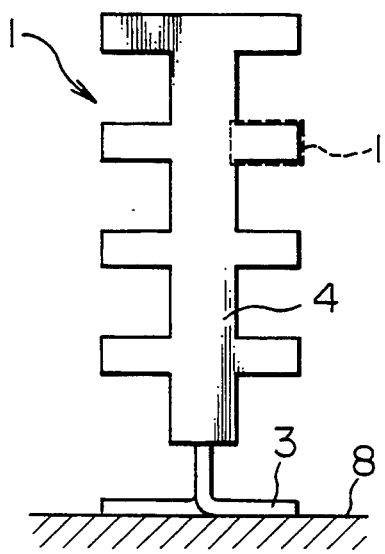
FIG. 5 is a side view of the semiconductor device when viewed from a direction of A in FIG. 1.
Figure 6:
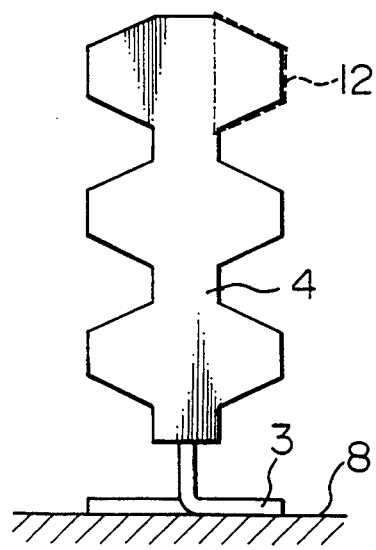
FIG. 6 is a side view of a semiconductor device having radiating fins, which are different in configuration from those of FIG. 1, when viewed from the direction of A.

As for the configuration of the side surface of the radiating fin 5, in addition to the rectangle as shown in FIG. 5, a trapezoid 12 shown in FIG. 6 (a part surrounded by a broken like), or a semicircle, a triangle or the like (not shown) may be available. In this case, the radiating fin 5 is formed by making a parallel translation of the trapezoid, the semicircle, the triangle or the like (the configuration when viewed from the direction of A of FIG. 1) in the direction of the length a of the semiconductor device.

In addition, a length of the radiating fin 5 (with respect to the same direction as the length a of the semiconductor device) may be equal to or shorter than the length a of the semiconductor device.

Next, the description will hereinbelow be given with respect to an example of a method of manufacturing the semiconductor device VSMP 1.

For example, the semiconductor chip 6 and the external connection terminals 2 are disposed in a predetermined jig (not shown) serving as a molding die, too, in which the irregular configuration for forming the radiating fins 5 is formed.

Then, the electrode parts of the semiconductor chip 6 and the inner lead parts of the external connection terminals 2 are connected to one another through the metallic wires 7 using known wire bonding techniques.

Further, in addition to the semiconductor chip 6 and the external connection terminals 2 which have been connected to one another using the wire bonding technique, the supporting terminals 3 are disposed in predetermined positions in the jig. Then, the liquid plastic resin in injected into the molding die to form the plastic package 4 having the mold structure. Then, both the external connection terminals 2 and the supporting terminals 3 are subjected to the lead forming, whereby the plastic mold type semiconductor device VSMP 1 is manufactured which has a small thickness of about 1.2 mm for example.

Subsequently, in the case where VSMP 1 thus completed is intended to be mounted on a surface of a substrate (not shown), for example, the conductor parts of the substrate is subjected to the solder plating, and also the pretinning is applied to the outer lead parts of the external connection terminals 2 and the supporting terminals 3 as well. Then, VSMP 1 is stood perpendicularly on the surface of the substrate, and the solder applied to the connection parts is melted and at the same time the pressure welding is performed, whereby a reflow soldering operation is completed.

Therefore, according to the semiconductor device of the present embodiment, the radiating fins 5 having the irregular configuration are formed on both sides of the plastic package integrally with the plastic package, whereby for example, even if the characteristics of the heat conduction of the plastic package are somewhat poor, since the surface area of the plastic package 4 can be increased by the provision of the radiating fins 5 having the irregular configuration, in cooperation with the virtue of heat radiation from the semiconductor device VSMP 1 to the outside due to the thin structure, the effect of heat radiation can be more effectively improved.

Figure 3:
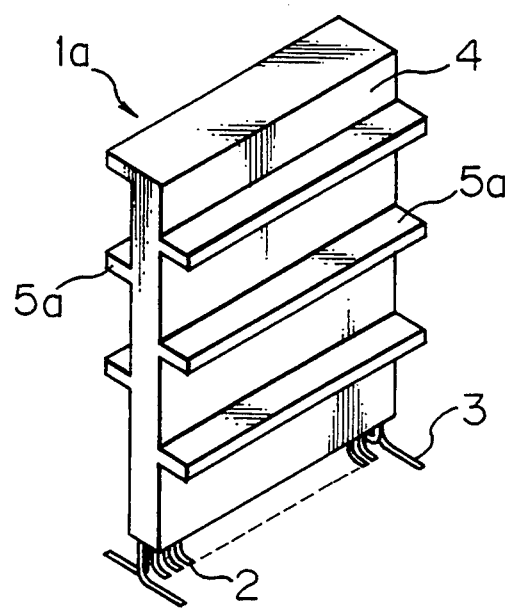
FIG. 3 is an exterior perspective view showing a structure of a semiconductor device as another embodiment of the present invention.
Figure 4:
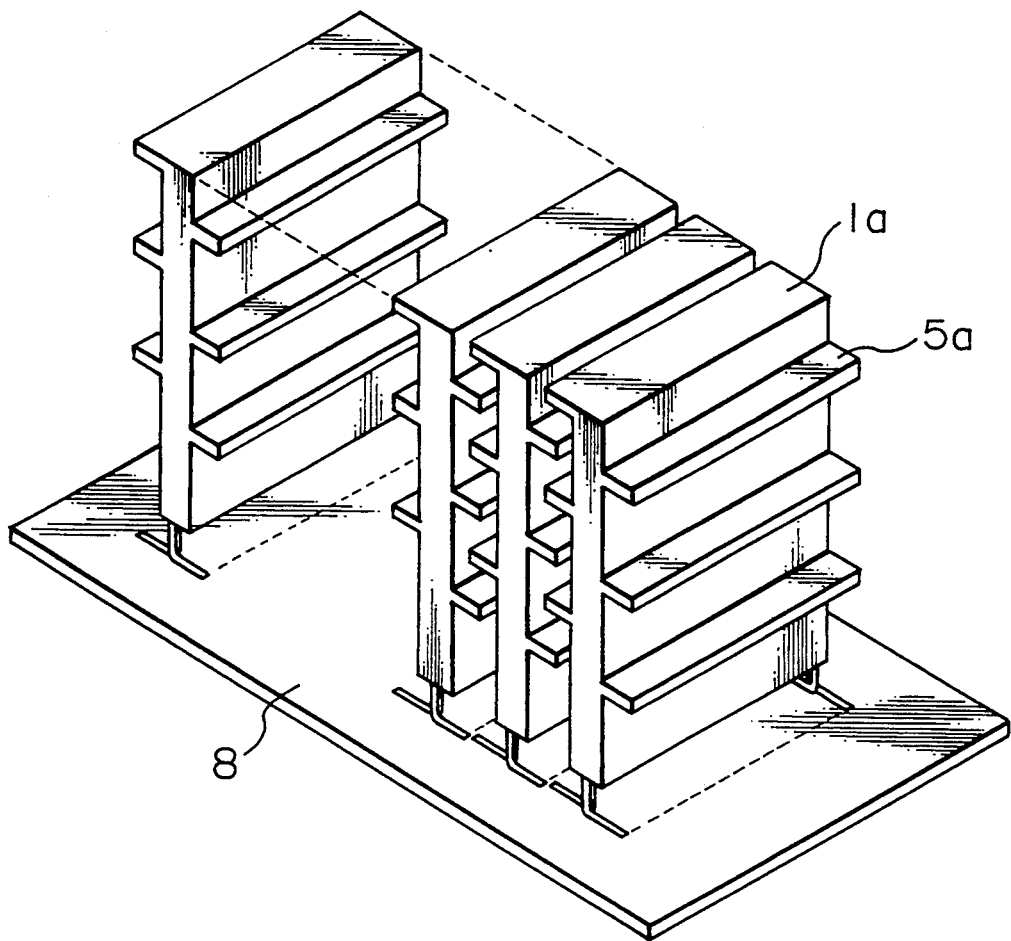
FIG. 4 is a schematic perspective view showing a state in which the semiconductor devices of the embodiment shown in FIG. 3 are mounted on a surface of a substrate.

FIG. 3 is an exterior perspective view showing a structure of a semiconductor device as another embodiment of the present invention. FIG. 4 is a schematic perspective view showing a state in which the semiconductor devices of the present embodiment are mounted on a surface of a substrate.

A semiconductor device (VSMP) 1a shown in FIG. 3 has the same structure as that of the semiconductor device (VSMP) 1 shown in FIG. 1 except that radiating fins 5a of VSMP 1a are necessarily provided on the both sides of the plastic package 4 and the radiating fins 5a provided on the right side of the plastic package 4 are different in position from the radiating fins 5a provided on the rear side of the plastic package 4.

In the semiconductor device VSMP 1a, a height of the radiating fin 5a provided on the right side (first surface) of the plastic package 4 from the bottom surface of the semiconductor device is different from a height of the associated radiating fin 5a provided on the rear side (second surface) of the plastic package 4 from the bottom surface of the semiconductor device. More specifically, the radiating fins 5a of the second surface are not provided in the positions on the second surface which confront with the associated positions on the first surface, in which the radiating fins 5a of the first surface are provided, through the plastic package 4. In other words, the radiating fins 5a of the first surface are not provided in the positions on the first surface, which confront with the associated positions on the second surface, in which the radiating fins 5a of the second surface are provided, through the plastic package 4. Therefore, in the case where a plurality of VSMPs 1a are closely mounted in parallel with one another on the surface of the substrate, the radiating fins 5a provided on the right side of the plastic package 4 of a certain VSMP 1a do not confront in position with the radiating fins 5a provided on the rear side of the plastic package 4 of the adjacent VSMP 1a in an uneven parallel manner so that those radiating fins 5a do not contact one another. As a result, a large number of VSMPs 1a can be mounted in parallel with one another on the same area of the surface of the substrate as that of the surface of the substrate on which a plurality of VSMPs 1 shown in FIG. 1 are mounted in parallel with one another.

FIG. 4 shows the state in which a plurality of VSMPs 1a shown in FIG. 3 are closely mounted in parallel with one another on the surface of the substrate 8. In FIG. 4, no radiating fin 5a is provided in the position on the rear side of the plastic package 4 confronting with the position, on the right side of the plastic package 4, which has the projecting part (i.e., the radiating fin 5a). Therefore, even if a large number of VSMPs 1a are closely arranged, no radiating fin 5a of any VSMP 1a contacts the associated radiating fin 5a of any adjacent VSMP 1a.

In general, the following can be said with respect to the semiconductor device VSMP 1a.

Even if a plurality of semiconductor devices VSMPs 1a each having the radiating fins 5a are mounted in parallel with one another on the surface of the substrate at regular intervals each being larger than a distance which is obtained by adding a maximum value of the width b of each radiating fin 5a, which the plastic package 4 has, and the width b of the plastic package to each other, no radiating fin 5a of the semiconductor device VSMP 1a does not contact the associated radiating fin 5a of the semiconductor device VSMP 1a adjacent thereto. Now, by the width of the radiating fin 5a, it means a length of the radiating fin 5a in the direction of the width b of the plastic package 4 when the surfaces (determined by both the length a and the height c) of the plastic package 4 are used as the reference.

As described above, according to the semiconductor device 1a shown in FIG. 3, the effect of heat radiation can be improved by the provision of the radiating fins 5a having the irregular configuration. In addition thereto, since the forming is performed in such a way that the positions of the radiating fins 5a provided on the right side of the plastic package 4 deviate from the associated positions of the radiating fins 5a provided on the rear side of the plastic package 4 in an uneven parallel manner, even if a plurality of VSMPs 1a are closely mounted in parallel with one another on the surface-of the substrate, the radiating fins 5a of a certain VSMP 1a do not contact the associated radiating fins 5a of the adjacent VSMP 1a, respectively. Therefore, VSMPs 1a can be mounted on a smaller area of the surface of the substrate.

Further, the method of manufacturing the semiconductor device VSMP 1a shown in FIG. 3 is the same in processing as the method of manufacturing the semiconductor device VSMP 1 shown in FIG. 1 except that a predetermined jig is employed which serves as the molding die, by which the plastic package is formed in such a way that the radiating fins provided on the right side of the plastic package deviate in position from the radiating fins provided on the rear side thereof in an uneven parallel manner.

Hereinabove, the preferred embodiments of the present invention have been described concretely. However, it is to be understood that the present invention is not limited to the above-mentioned embodiments or thereby, and variations may be made by one skilled in the art without departing from the spirit and scope of the present invention.

For example, with respect to the semiconductor devices according to the above-mentioned embodiments, the description has been given to the specific case where the radiating fins 5, 5a are formed on the both sides of the plastic package 4 integrally with the plastic package 4. However, the present invention in not limited to the above-mentioned embodiments or thereby. That is, the present invention is also applicable to the case where the radiating fins are provided on either the right side or rear side of the plastic package, i.e., only one side of the plastic package.

Further, as described above, the structure of the radiating fins 5a is not limited to the specific structures as shown in FIGS. 1 and 3. That is, it is to be understood that various variations may be made in such a way that for example, the number of projecting parts and the number of recess parts are increased, the configuration thereof is suitably changed, and the positions of the radiating fins provided on the right side of the plastic package is made different from the positions of the radiating fins provided on the rear side of the plastic package.

Figure 7:
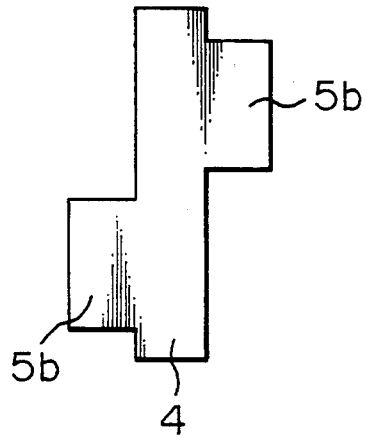
FIG. 7 is a plan view showing a structure of a semiconductor device of still another embodiment of the present invention.

For example, radiating fins having a configuration as shown in FIG. 7 is also available.

FIG. 7 is a plan view showing a structure of a semiconductor device VSMP 1b. In the figure, for the sake of simplicity, the supporting terminals and the external connection terminals shown in FIG. 1 are not illustrated. In this case, radiating fins 5b are provided in such a way that the positions of the radiating fins 5b of the right side of the plastic package deviate from the positions of the radiating fins 5b of the rear side of the plastic package in the direction of the length a of the plastic package. Therefore, in the case where a plurality of semiconductor devices VSMP 1b are mounted in parallel with one another on the surface of the substrate, since any radiating fin 5b of a certain VSMP 1b does not contact the associated radiating fin 5b of the adjacent VSMP 1b, VSMPs 1b can be closely mounted thereon. In addition, in the semiconductor device 1b shown in FIG. 7, the radiating fins 5b provided on the right side of the plastic package deviate in position from the radiating fins 5b provided on the rear side of the plastic package. Therefore, the heights (distances) of the radiating fins of the right side of the plastic package from the bottom surface of the semiconductor device may be equal to those of the associated radiating fins of the rear side of the plastic package from the bottom surface of the semiconductor device, respectively.

The typical effects of the present invention disclosed in the present specification are as follows.

(1) The radiating fins having the irregular configuration are provided on either one side or both sides of the plastic package encapsulating the both sides of the semiconductor chip, whereby the area of the surface of the plastic package to contact the air can be increased. On the other hand, the prior art semiconductor device has the thin package structure having no radiating fin, and thus the heat radiation to the outside of the package is not sufficiently performed. Therefore, according to the present invention, as compared with the prior art semiconductor device having no radiating fin, it is possible to further improve the effect of heat radiation of the semiconductor device.

(2) In the case where the radiating fins having the irregular configuration are provided on the both sides of the plastic package, the radiating fins provided on the right side of the plastic package do not confront in position with the radiating fins provided on the rear side of the plastic package through the plastic package, whereby in the case where a plurality of semiconductor devices are mounted in parallel with one another on the surface of the substrate, the semiconductor devices can be closely mounted thereon, and in cooperation with the virtue of shortening of the mounting pitch due to the thin structure, the semiconductor devices can be mounted on the smaller area of the surface of the substrate.

(3) The radiating fins having the irregular configuration are formed on either both sides or one side of the plastic package so as to extend in the direction of the length of the semiconductor device. Then, if the semiconductor device is forcedly cooled along the direction of the length by the fan, any radiating fin does not hinder the air flow while cooling the semiconductor device. Therefore, good air flow can be obtained, and thus it is possible to further improve the effect of heat radiation.

(4) From the above-mentioned effects (1) to (3), especially in the semiconductor device VSMP having the plastic package with a very small thickness encapsulating the semiconductor chip, even if the semiconductor chip contained therein has the large power consumption, it is possible to obtain the semiconductor device in which the effect of heat radiation can be effectively improved.

(5) From the above-mentioned effects (1) to (3), since the inexpensive plastic package can be used for the semiconductor chip having the large power consumption as well, it is possible to obtain the semiconductor device having the plastic package which can be made low in cost.

What is claimed is:

1. A semiconductor device (Vertical Surface Mount Package) having a semiconductor chip encapsulated with a plastic package, external connection terminals through which signals are transmitted between said semiconductor chip and peripheral circuits, said plastic package having a substantially rectangular parallelopiped shape defined by a length, a width and a height, said external connection terminals being extracted to the outside of said plastic package, and supporting terminals for mounting said plastic package on a substrate so as for first and second surfaces of said plastic package defined by both the length and the height to be substantially perpendicular to said substrate, said semiconductor device having a radiating part being characterized in that said first surface of said plastic package has radiating fins having an irregular configuration, said second surface of said plastic package has radiating fins having an irregular configuration, and each of said radiating fins is formed so as to extend in a direction of the length of said plastic package, and that said radiating fins of said second surface are present in positions on said second surface which are different from positions on said second surface which confront with the positions on said first surface, in which said radiating fins of said first surface are present, through said plastic package.

2. A semiconductor device according to claim 1, wherein the positions of said radiating fins having the irregular configuration, provided on said first surface, in a direction of the height from a surface defined by both the length and the width of said plastic package are different from the positions of said radiating fins having the irregular configuration, provided on said second surface, in a direction of the height from the surface defined by both the length and the width of said plastic package.

3. A semiconductor device according to claim 1, wherein the positions of said radiating fins having the irregular configuration, provided on said first surface, in a direction of the length from a surface defined by both the width and the height of said plastic package are different from the positions of said radiating fins having the irregular configuration, provided on said second surface, in a direction of the length from the surface defined by both the width and the height of said plastic package.

4. A semiconductor device (Vertical Surface Mount Package) having a semiconductor chip encapsulated with a plastic package, external connection terminals through which signals are transmitted between said semiconductor chip and peripheral circuits, said plastic package having a substantially rectangular parallelopiped shape defined by a length, a width and a height, said external connection terminals being extracted to the outside of said plastic package, and supporting terminals for mounting said plastic package on a substrate so as for first and second surfaces of said plastic package defined by both the length and the height to be substantially perpendicular to said substrate, said semiconductor device having a radiating part being characterized in that said first surface of said plastic package has radiating fins having an irregular configuration, and said second surface of said plastic package has radiating fins having an irregular configuration, and each of said radiating fins is formed so as to extend in a direction of the length of said plastic package, and wherein the radiating fins of said first surface are opposite to said second surface through said plastic package, and the radiating fins of said second surface are opposite to said first surface, through said plastic package, such that the radiating fins of said first surface and said radiating fins of said second surface are not directly opposite one another through said plastic package.

5. A semiconductor device (Vertical Surface Mount Package) having a semiconductor chip encapsulated with a plastic package, external connection terminals through which signals are transmitted between said semiconductor chip and peripheral circuits, said plastic package having a substantially rectangular parallelopiped shape defined by a length, a width and a height, said external connection terminals being extracted to the outside of said plastic package, and supporting terminals for mounting said plastic package on a substrate so as for first and second surfaces of said plastic package defined by both the length and the height to be substantially perpendicular to said substrate, said semiconductor device having a radiating part being characterized in that said first surface of said plastic package has first radiating fins, and said second surface of said plastic package has second radiating fins, wherein each of said first and second radiating fins is formed so as to extend in a direction of the length of said plastic package, and wherein the first radiating fins of said first surface are opposite to said second surface through said plastic package, and the second radiating fins of said second surface are opposite to said first surface, through said plastic package, such that the first radiating fins of said first surface and said second radiating fins of said second surface are not directly opposite one another through said plastic package.

* * * * *